United States Patent [19]

Hess

[11] Patent Number: 4,807,794

[45] Date of Patent: Feb. 28, 1989

[54] METHOD AND EQUIPMENT TO SOLDER PRINTED-CIRCUIT ASSEMBLIES

[75] Inventor: Fritz Hess, Mettmenstetten, Switzerland

[73] Assignee: EPM AG, Switzerland

[21] Appl. No.: 149,189

[22] Filed: Jan. 27, 1988

[30] Foreign Application Priority Data

Jan. 28, 1987 [CH] Switzerland .................... 295/87

[51] Int. Cl.⁴ ................ H05K 3/34; B23K 37/04
[52] U.S. Cl. ............................ 228/102; 228/180.1; 228/260; 228/7; 228/10; 228/37; 228/43; 269/46; 269/111; 269/903
[58] Field of Search ........... 228/7, 10, 102, 180.1, 228/260, 37, 43; 269/46, 111, 903

[56] References Cited

U.S. PATENT DOCUMENTS 4,363,434  12/1982  Flury ........................ 228/37

FOREIGN PATENT DOCUMENTS 0118091  9/1984  European Pat. Off. .
0203623  12/1986 European Pat. Off. .
3501376  7/1986  Fed. Rep. of Germany .
156568   9/1984  Japan ........................ 228/43
961880   9/1982  U.S.S.R. .................... 228/43

Primary Examiner—Nicholas P. Godici
Assistant Examiner—Samuel M. Heinrich
Attorney, Agent, or Firm—Lowe, Price, LeBlanc, Becker & Shur

[57] ABSTRACT

To match the soldering of an assembled printed-circuit board (13) to its assembly configuration, the circuit board (13) is brought in contact with a soldering wave (21) for a first time along a predetermined path (57, 58), and thereupon the circuit board is rotated about a vertical axis and is brought into contact, preferably with the same soldering save (21), a second time, along predetermined paths from the same direction during its motion along the paths (57, 58). The printed circuit board (13) may be rotated by an angle (α) depending on the assembly configuration relative to the direction of flow (56) of the soldering wave (21).

12 Claims, 2 Drawing Sheets

METHOD AND EQUIPMENT TO SOLDER PRINTED-CIRCUIT ASSEMBLIES

TECHNICAL FIELD

The invention relates to a method of soldering assembled printed circuit boards and to an apparatus for carrying out the method.

BACKGROUND ART

As the dimensions of circuit components become increasingly smaller, their number per unit area on the printed circuit board becomes even larger, accordingly, the soldering sites also become ever smaller. The component assembly on printed circuit boards—namely for the mass produced apparatus of entertainment electronics, telecommunications and computer chips—is carried out with very high accuracy by automated assembly machinery. The conducting strips then are connected by soldering to the terminals of the circuit elements. Various procedures are known for soldering.

In a known procedure of the above type, the printed circuit board is preheated and as a rule is brought into contact, along the path which rises somewhat relative to the horizontal, with the top area of a flowing soldering wave or even with two soldering waves. The direction of flow of the soldering wave may be in the same direction as, or opposite to, that of the advancing circuit board. Where two soldering waves are used, their directions of flow may be mutually opposite.

Typically, the assembled printed circuit boards are placed in controlled, displaceable, advance frames of which the path of advance is determined by a driven conveyance means. Such advance frames comprise insets which, in turn, are provided with clearances the shape of which accurately match the contour of the printed circuit board to be solder. To operate a soldering product on line or track, that is a finishing track comprising also a station for applying fluxing agents, a preheating station and lastly a wave soldering system, a plurality of advance frames with the corresponding insets will be required. Typically, it is attempted to insert rectangular printed circuit boards into typically rectangular insets in such a process, the two mutually opposite sides of the printed circuit boards are thus parallel to the direction of advance and thereby to the direction of flow of the soldering wave, when the former comes to make contact with the latter.

It has been found, however, that the quality of soldering in a printed circuit board depends on the configuration, that is the "geographic" arrangement, of the circuit elements assembly when the printed circuit comprises components (chips) on the side to be soldered. This assembly configuration now is quite unrelated to the contour of the printed circuit board, aside the obvious fact that the assembly must be within the contour.

Therefore, it has previously been suggested to orient the clearances in the insets of the advance frames at an angle to the direction of advance such that, for a specific configuration of component assembly, optimal soldering shall be achieved. Yet the magnitude of this angular deviation can be ascertained only empirically, whereby the optimal angle requires trying out many different insets, and then equipping all present advance frames with insets wherein the clearances provide the optimal angular offset.

The consequence is tradeoff in that the space within the advance frame is not being utilized optimally, that is, the advance frame is not provided with insets having the theoretically maximum number of clearances.

Not only is such a procedure quite time-consuming, but it also requires a great expenditure of effort, material and time to refit a soldering track.

Moreover, it was found that even for the case of two soldering wave machines with two mutually opposite soldering waves the soldering is not optimal because, manifestly, here again the result is highly dependent on the configuration of the assembly.

A prior art method, such as referenced in the preamble of the claim 1, can be construed as previously known from the German patent document No. A1 3,501,376. Therein, two sequentially mounted soldering waves are provided, and the printed circuit boards, mounted in the conventional insets of a conventional advance system, are consecutively brought into contact along a straight path with the top of the first and then the top of the second soldering wave. The soldering waves are arranged at a slant to the direction of advance of the advance system, whereby an acute angle results between the two mutually facing sides of the printed circuit boards and the direction of flow of the soldering shafts. While this acute angle lengthens the path along which the side of the printed circuit board to be soldered will be contacted, or "licked", by the top of the soldering wave, the side of the printed circuit board to be soldered will only be contacted from one side. Thus, in such a prior art approach, soldering sites following an elevated circuit element (chip), rising from the circuit board, will be in the "shadow" of this circuit element and therefore the soldering wave will not reach those soldering sites.

It is noted herein for the sake of completeness that it is further known to solder assembled printed circuit boards in the absence of advance frames. This is accomplished by a so-called "finger conveyor", wherein the printed circuit boards are seized at opposite edges by driven clamping fingers with barbs, the fingers being mounted on either side of the advance path to an endless, revolving and guided conveyor member. While advance frames are thus no longer required, a finger conveyor is designed only for a single format of printed circuit boards which are moved parallel to one of their sides over the soldering wave. Moreover, there is the danger of the printed circuit boards being bent during preheating and soldering.

Another soldering procedure with or without advance frames, is known as "reflow soldering" by those skilled in the art. Therein, the still unassembled printed circuit board is silkscreen printed with a paste containing solder and flux only at the future soldering sites, and thereafter the printed circuit board is assembled with components in an automated machine and, following this assembly, is heated, for instance by infrared, whereby the solder melts in the past and the conducting strips are connected by solder to the terminals of the components. However, reflow-soldering has hardly found any acceptance in practice, probably in part because extraordinary accuracy and coincidence are absolutely necessary both in printing and assembling.

DISCLOSURE OF INVENTION

Accordingly, one object of the invention is to provide a method and apparatus of the previously cited kind wherein the cited drawbacks of the state of the art are extensively avoided and which assure optimal solder connections, even for small production runs, without requiring large trials to be carried out, along with corresponding expenditures.

As regards the method, this object is achieved by bringing the printed circuit board into contact with a flowing solder wave along a first path, rotating the printed circuit board about a vertical axis, and by subjecting the printed circuit board to the second soldering along a second path. Due to the printed circuit board following its first contact with the soldering wave being rotated about the vertical axis before the second soldering by the said wave, that side of the printed circuit board which must be soldered is licked by the said wave from two directions relative thereto, and these two directions may be optimally matched to the configuration of the assembly.

The features of preferred implementations of the method are stated in claims 2 through 9.

The equipment proposed herein to carry out the method provides advance means, including a gripper head displaceable in at least two coordinate directions and rotatable about at least one axis parallel to the directions. The head is driven by a computer and is designed to serge a circuit board from a preheating station. The head is further designed to bring the circuit board, by means of its soldering side, along one of two computer generated paths to contact a soldering wave twice.

Further advantages are elucidated in the description below given in purely illustrative manner and relating to the drawings.

BEST MODE FOR CARRYING OUT THE INVENTION

Figure 1:
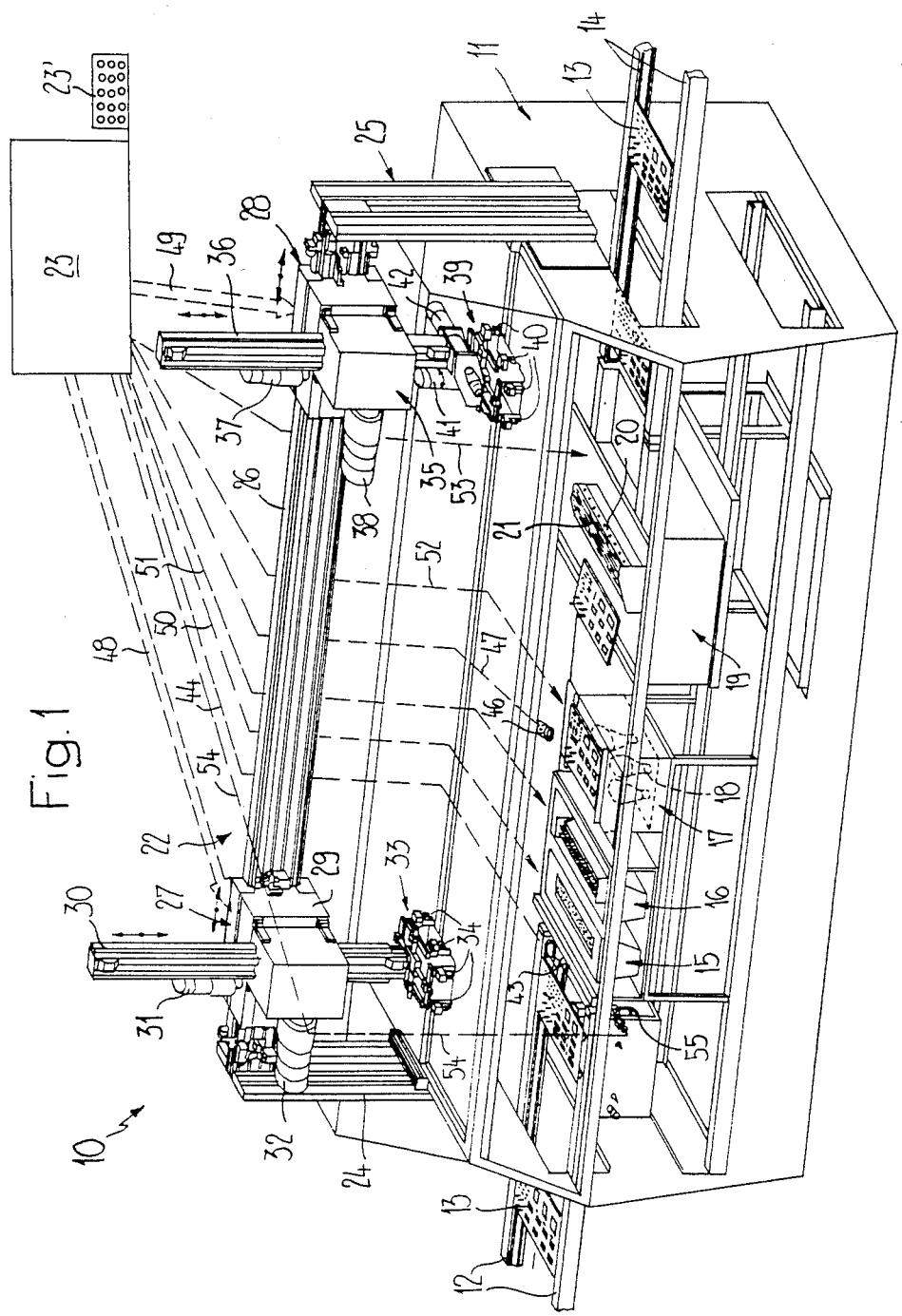
FIG. 1 is a perspective of equipment with which to carry out the method.

In the equipment 10 shown in FIG. 1, the lower part essentially consists of a conventional soldering track 11 receiving an assembled printed circuit board 13 from a feeder 12, this board being evacuated by a removal means 14 following soldering.

The conventional soldering track 11 comprises the following stations: two flux-deposit stations (the so-called "fluxers") 15, 16 where the fluxing agents required for the application are supplied on the underside of the printed circuit board 13. Illustratively, the fluxer 15 is the foaming type. Therein, the underside of the printed circuit board 13 is made to contact a wave of a fine-pore fluxing foam. The fluxer 16 is a spray type, wherein the fluxing agent is deposited as an atomized jet. The fluxers 15, 16 are followed by a preheating station 17 wherein the underside of the printed circuit board 13 is preheated by infrared lamps 18. The preheating station 17 is followed by a conventional wave soldering system 19 which, by means of a pump (not shown) generates through a slotted nozzle 20 a continuously flowing solder wave 21. This terminates the brief description of the known soldering track 11 for assembled printed circuit boards.

The advance of the printed circuit boards 13 from the feeder 12 through the soldering track 11 to the removal means 14 is implemented by a conveyor system, denoted broadly by the reference numeral 22, and controlled by the diagrammatically shown computer 23.

The conveyor system comprises a guide rail 26 resting on support posts 24, 25, spanning the soldering track 11 like a gantry. Two individually powered robots 27, 28 can be displaced horizontally parallel to soldering track 11, along track 26. The robot unit 27 is equipped with a drive box 29 displaceably supported on the guide rail within which rests a lift-bar 30 in a vertically displaceable manner. Two motors 31, 32, controlled by the computer 23, are mounted on the drive box 29, one motor providing the horizontal motion of the drive box 29 along the guide rail 26 and the other motor providing the vertical motion of the lift-bar 30. The lift bar 30 is provided at its lower end with a gripper head 33 equipped with a total of eight gripers 34 actuated electromagnetically or pneumatically and which, in pairs, grip the printed circuit boards at their four sides.

The robot unit 28 also comprises a drive box 35 displaceably supported on the guide rail 26. A lift bar 36 rests in a vertically displaceable manner in the drive box 35. Motors denoted by 37 and 38 and controlled by the computer 23 are mounted to the drive box 35, one of these motors providing the horizontal motion of the drive box 35 and the other motor the vertical motion of the lift bar 36. The lift bar 36 is provided at its lower end with a gripper head 39. Head 39, similarly to the gripper head 33, is equipped with a total of eight grippers 40, which grippers may be actuated pneumatically or electromagnetically. Additionally, head 39 is rotatable as a unit, by means of a motor 41, about a vertical axis parallel to the longitudinal direction of the lift rod and, by means of another motor 42, about a horizontal axis orthogonal to the longitudinal direction of the guide rail 26.

Figure 3:
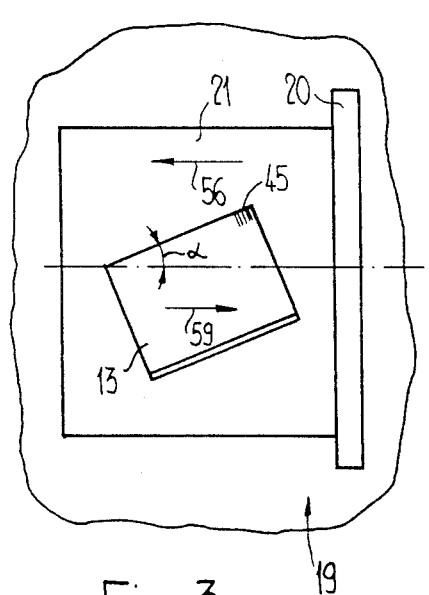
FIG. 3 is a topview relating to FIG. 2, a printed circuit board (unassembled) being shown diagrammatically.
Figure 5:
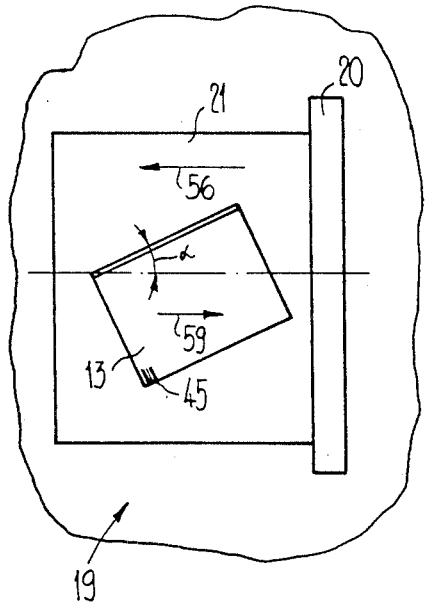
FIG. 5 is a topview relating to FIG. 4.

A sensor 43 is mounted in the delivery area of the feeder 12 and is connected by data line 44 to the computer. Sensor 43 is designed to ascertain the arrival of an assembled printed circuit board 13 at the end of the feeder 12, to read a machine-readable coding 45 (FIGS. 3,5), and to supply the corresponding data to the computer 23. The meaning of the codings 45 is discussed further below.

A temperature sensor 46, illustratively an infrared measuring head, is present in the area of the preheating station 17 and is directed on the particular printed-circuit board 13 in the said station. Sensor 46 is also connected through a data line 47 to the computer 23. The computer 23 is programmed to control, by means of a bus 48, all the drive elements of the robot 27. According to another program, and through another bus 49, computer 23 controls all the drive elements of the robot 28.

The fluxers 15 and 16 are respectively turned ON or OFF by the computer 23 through the control lines 50, 51 and, by means of a control line 52, the infrared lamps 18 of the preheating station 17 are turned ON or OFF. Lastly the computer drives the wave soldering system 19 through a control line 53.

The description below of the operation of the equipment shown in FIG. 1 also shall provide guidance to one of ordinary skill in the art for those components of the equipment 10 which are not explicitly described and/or shown herein but which nevertheless are required to operate this equipment.

The sensor 43 at the end of the feeder 12 notifies computer 23, through the data line 44, that there is present a printed circuit board 13 for soldering. The sensor also transmits to the computer the data from the read coding 45. Thereupon, through a data line 54, the computer actuates a pneumatic or electromagnetic lifting element 55 at the end of the feeder 12 to lift the printed circuit board from the feeder 12. Simultaneously, the computer 23 commands the robot 27 to be in the end position on the left of FIG. 1, to lower its gripper head 33 with its open grippers 34 and to seize the ready printed circuit board 13. Thereupon the gripper head 33 is slightly raised and the robot 27 is moved rapidly toward the flexures 15, 16, illustratively at a speed of 6 m/s. At the same time, the robot's position is transmitted to the computer 23. Depending on the kind of deposition wanted, the computer 23 actuates either one of fluxers 15, 16 and reduces the speed of the robot 27, illustratively to 1 m/s, the moment this robot arrives at the activated fluxer. After the fluxing agent has been deposited in the activated fluxer, the robot 27 is rapidly displaced to the preheating station 17, whereupon the gripper head 33 is lowered and the grippers 34 are opened. Thereby the printed circuit board has been laid on the preheating station 17 of which the infrared lamps 18 are switched ON simultaneously. Now the gripper head 33 is raised and the entire robot 27 rapidly moves back into the end area of the feeder 12.

The temperature sensor 46 continuously measures the temperature of the printed circuit board at the preheating station 17 and transmits the temperature data to the computer 23. The moment a temperature value stored in the computer 23 has been reached, the robot 28 will be activated, its gripper head 39 seizing the preheated printed circuit board and rotating it horizontally about an angle a (FIG. 3) and moving it, along a path determined by the computer 23 and at a speed also determined by the computer 23 (for instance between $\frac{1}{2}$ and 3 m/s), to the soldering wave 21 to be soldered a first time.

Figure 2:
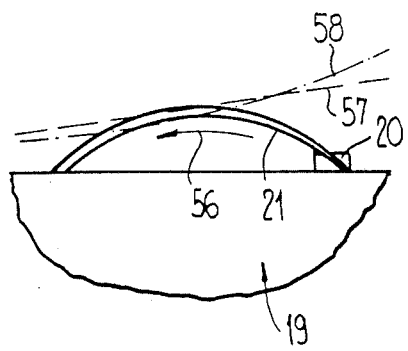
FIG. 2 is a strongly schematic sideview of a soldering wave, also showing two possible paths along which the printed circuit board can be made to touch the wave a first time.

The direction of flow of the soldering wave 21 is indicated by the arrow 56 in FIGS. 2 through 5. In FIG. 2, a dashed line 57 indicates a straight, sloping path and a dashed line 58 shows a curved path increasingly deviating from the horizontal and followed by the printed circuit board held in the gripper head 39 during the first soldering in the soldering wave 21 in the direction of the arrow 59.

Figure 4:
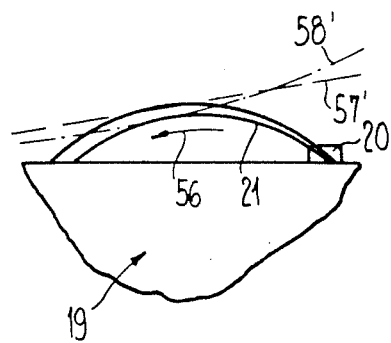
FIG. 4 is an illustration similar to that of FIG. 2, showing two possible paths along which the printed circuit board can be made to touch the soldering wave a second time.

Following this first soldering, the gripper head 39 is raised, the robot 28 is rapidly moved back and the gripper head 39 simultaneously—while being rotatd horizontally, in this instance by 180°—is lowered again, in order to bring the printed circuit board into contact with the soldering wave 21 a second time, along one of the paths 57', 58' (FIG. 4).

Thereupon the gripper head 39 is raised and the robot 28 is rapidly displaced across the initial area of the removal means 14, the gripper head 39 is lowered and, thereupon, due to the opening of the grippers 40, the printed circuit board 13 arrives on the removal means 14 which then evacuates it.

In the described example, the printed circuit board is rotated by 180° following the first soldering by the soldering wave, whereby the angle α is the same for both passages. Both the angle of rotation in the first pass, and the angle of rotation following the first pass and before the second pass, the curved paths to be described in relation to both passes, and the corresponding speeds, are optimally matchable by the computer 23 to the particular assembly configuration of every printed circuit board. Only a few trials are necessary to determine these parameters from case to case. Illustratively these parameters can be generated in the form of a bar code and if every printed circuit board to be soldered is provided with such a marking representing the suitable parameters, consecutive printed circuit boards assembled in different ways can be soldered practically without reconverting. The said parameters also may be fed by a keypad 23' into the computer 23 for trial purposes.

Per se the method can also be carried out with so-called "2-wave solder tracks". In that case, following the first soldering at the soldering wave, the printed circuit board is rotated about the vertical axis, for instance by 180°, and is presented only then for soldering at the second wave.

What is claimed is:

1. In a method for soldering assembled printed-circuit boards, wherein each printed-circuit board (13) is preheated on a side requiring soldering and provided with a fluxing agent and, in a warm state, said side is twice brought into contact with a flowing soldering wave (21), along a path (57,58), two mutually opposite lateral edges of the printed-circuit board (13) subtending an acute angle (α) relative to a direction of flow (56) of the soldering wave (21), the improvement comprising the step of rotating the printed-circuit board (13) about a vertical axis following a first soldering and
 subjecting the printed-circuit board to a second soldering along a further path (57',58').

2. The method defined in claim 1, comprising the further step of bringing the printed-circuit board (13) into contact with the same soldering wave (21) for the first soldering and for the second soldering.

3. The method defined in claim 2, comprising the step of bringing the printed-circuit board (13) into contact with the soldering wave (21) from the same side for both the first soldering and the second soldering.

4. The method defined in claim 1, wherein said rotating step following the first soldering comprises rotating the printed-circuit board substantially by 180°.

5. The method defined in claim 1, comprising the step of digitally controlling said path and said further path.

6. The method defined in claim 1 comprising the step of displacing the printed-circuit board (13) at least in the vicinity of one (21) of the soldering waves along a path (58, 58') increasingly rising above the horizontal.

7. The method defined in claim 1 comprising the step of sensing a temperature of the printed-circuit board (13) during the preheating step, and
 upon reaching a predetermined temperature, seizing the printed-circuit board individually and bringing the printed circuit board into contact with the soldering wave (21) along the path (57, 58).

8. The method defined in claim 1 comprising the step of controlling the two paths (57, 57'; 58, 58') to assume at least approximately the same shape.

9. The method defined in claim 7, comprising the further steps of providing the printed-circuit board (13) with a machine-readable coding (45) and determining, from said machine-readable coding, the paths (57, 57'; 58, 58') and the acute angle (α) of the mutually opposite lateral edges of the printed-circuit board (13) relative to the direction of flow (56) of the soldering wave (21).

10. In an apparatus for soldering assembled printed-circuit boards, wherein each printed-circuit board (13) is preheated on a side requiring soldering and provided with a fluxing agent and, in a warm state, said side is twice brought into contact with a flowing soldering wave (21) along a path (57,58), two mutually opposite lateral edges of the printed-circuit board (13) subtending an acute angle ($\alpha$) relative to a direction of flow (56) of the soldering wave (21), including a preheating station (17) followed by a wave soldering system (19) and advance means (22) for moving printed-circuit boards (13) from the preheating station (17) through the wave soldering system (19) to a removal means (14), the improvement comprising a gripper head means in the advance means (22), said gripper head means (39) displaceable in at least two coordinate directions and rotatable about at least one axis parallel to said coordinate directions, a computer means (23) for determining driving paths for said gripper head means, said head means (39) operable for seizing one printed-circuit board (13) at a time from the preheating station (17), twice bringing the seized printed circuit board, by means of its soldering side, into contact with a soldering wave (21) of the wave soldering system (19) along one of the computer determined paths (57, 58; 57', 58').

11. Apparatus defined in claim 10, further comprising a temperature sensor (46) in the preheating station (17) to measure the temperature of the printed-circuit board (13) in the preheating station, said sensor being connected to the computer means (23), wherein said computer means (23) is operable for controlling displacement of the gripper head (39) when the temperature of the printed-circuit board (13) reaches a predetermined value.

12. Apparatus defined in claim 10, further comprising a feeder (12) for supplying the printed-circuit boards (13) to be soldered, a machine readable coding (45) provided on the printed circuit board, a sensor (43) mounted in an end area of the feeder (12) and connected to said computer means (23), said sensor being arranged to determine the presence of a printed-circuit board (13) and for reading the coding (45) on the circuit board (13).

* * * * *